United States Patent
Zitlaw

(10) Patent No.: US 11,106,604 B2
(45) Date of Patent: *Aug. 31, 2021

(54) VARIABLE READ LATENCY ON A SERIAL MEMORY BUS

(71) Applicant: Cypress Semiconductor Corporation, San Jose, CA (US)

(72) Inventor: Clifford Zitlaw, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/810,241

(22) Filed: Mar. 5, 2020

(65) Prior Publication Data

US 2020/0301856 A1 Sep. 24, 2020

Related U.S. Application Data

(63) Continuation of application No. 16/383,078, filed on Apr. 12, 2019, now Pat. No. 10,613,997, which is a continuation of application No. 14/228,384, filed on Mar. 28, 2014, now Pat. No. 10,303,625, which is a continuation of application No. 13/668,935, filed on Nov. 5, 2012, now Pat. No. 8,725,920, which is a continuation of application No. 12/646,291, filed on Dec. 23, 2009, now Pat. No. 8,327,052.

(51) Int. Cl.
*G06F 13/16* (2006.01)
*G06F 13/42* (2006.01)
*G11C 7/22* (2006.01)

(52) U.S. Cl.
CPC ........ *G06F 13/161* (2013.01); *G06F 13/1689* (2013.01); *G06F 13/4243* (2013.01); *G06F 13/4291* (2013.01); *G11C 7/22* (2013.01)

(58) Field of Classification Search
CPC ........ G06F 13/14; G06F 13/16; G06F 13/161; G06F 13/38; G06F 13/42; G06F 13/4234; G06F 13/4239; G06F 13/4243; G06F 13/4282; G06F 13/4291; G06F 13/1689; G11C 7/22

See application file for complete search history.

(56) References Cited

U.S. PATENT DOCUMENTS

| | | | |
|---|---|---|---|
| 5,495,240 | A | 2/1996 | Heberle |
| 6,131,127 | A * | 10/2000 | Gafken ................. G06F 13/423 710/1 |
| 7,019,866 | B1 | 3/2006 | Beck et al. |
| 7,571,279 | B2 | 8/2009 | Sade et al. |
| 7,571,297 | B2 | 8/2009 | Gould et al. |
| 7,624,209 | B1 | 11/2009 | Ansari et al. |
| 8,291,126 | B2 | 10/2012 | Zitlaw |
| 8,327,052 | B2 | 12/2012 | Zitlaw |

(Continued)

OTHER PUBLICATIONS

"SanDisk Secure Digital Card." Product Manual. Version 1.9. Document No. 80-13-00169. Dec. 2003. SanDisk Corporation.

(Continued)

*Primary Examiner* — Thomas J. Cleary

(57) ABSTRACT

Example apparatus, systems, and methods receive a request for data associated with an address and responsively access a memory array to obtain the data. Embodiments transition a bus from a first state to a second state and after the transitioning of the bus, drive the data onto the bus.

8 Claims, 10 Drawing Sheets

(56) References Cited

U.S. PATENT DOCUMENTS

| | | | |
|---|---|---|---|
| 8,725,920 B2 | 5/2014 | Zitlaw | |
| 9,754,648 B2* | 9/2017 | Mirichigni | G11C 7/22 |
| 10,303,625 B2* | 5/2019 | Zitlaw | G06F 13/161 |
| 10,613,997 B2* | 4/2020 | Zitlaw | G06F 13/161 |
| 2003/0182495 A1* | 9/2003 | Chang | G06F 13/4243 |
| | | | 711/103 |
| 2003/0200359 A1* | 10/2003 | Fernald | G06F 13/4291 |
| | | | 710/5 |
| 2004/0049616 A1 | 3/2004 | Dunstan et al. | |
| 2004/0116151 A1 | 6/2004 | Bosch et al. | |
| 2005/0068812 A1 | 3/2005 | Oh | |
| 2005/0157718 A1 | 7/2005 | Yoshimoto | |
| 2005/0259609 A1 | 11/2005 | Hansquine et al. | |
| 2006/0026375 A1 | 2/2006 | Christenson et al. | |
| 2007/0186021 A1 | 8/2007 | Drexler et al. | |
| 2007/0286078 A1 | 12/2007 | Coteus et al. | |
| 2009/0085631 A1 | 4/2009 | Lambrecht et al. | |
| 2011/0238866 A1 | 9/2011 | Zitlaw | |

OTHER PUBLICATIONS

128 MB Burst CellularRAM 1.5 memory, 2005, The CellularRAM Workgroup.
USPTO Final Rejection for U.S. Appl. No. 12/729,905 dated Dec. 5, 2011, 7 pages.
USPTO Final Rejection for U.S. Appl. No. 14/228,384 dated Jun. 13, 2016, 12 pages.
USPTO Non Final Rejection for U.S. Appl. No. 16/383,078, dated on Oct. 16, 2019; 16 pages.
USPTO Non-Final Rejection for U.S. Appl. No. 12/646,291 dated Apr. 18, 2012, 15 pages.
USPTO Non-Final Rejection for U.S. Appl. No. 12/729,905 dated Jun. 22, 2011, 6 pages.
USPTO Non-Final Rejection for U.S. Appl. No. 13/668,935 dated Sep. 9, 2013, 17 pages.
USPTO Non-Final Rejection for U.S. Appl. No. 14/228,384 dated Apr. 8, 2016, 13 pages.
USPTO Notice of Allowance for U.S. Appl. No. 12/646,291 dated Aug. 3, 2012, 9 pages.
USPTO Notice of Allowance for U.S. Appl. No. 12/729,905 dated Mar. 9, 2012, 7 pages.
USPTO Notice of Allowance for U.S. Appl. No. 13/668,935 dated Dec. 26, 2013, 6 pages.
USPTO Notice of Allowance for U.S. Appl. No. 14/228,384 dated Feb. 6, 2019; 5 pages.
USPTO Notice of Allowance for U.S. Appl. No. 14/228,384 dated Sep. 28, 2018, 5 pages.
USPTO Notice of Allowance for U.S. Appl. No. 16/383,078, dated Nov. 27, 2019; 5 pages.
USPTO Restriction Requirement for U.S. Appl. No. 12/646,291 dated Mar. 21, 2012, 6 pages.

\* cited by examiner

VARIABLE READ LATENCY ON A SERIAL MEMORY BUS

CROSS-REFERENCE TO RELATED APPLICATIONS

This application is a Continuation of U.S. patent application Ser. No. 16/383,078, filed on Apr. 12, 2019, which is a Continuation of U.S. patent application Ser. No. 14/228,384, filed on Mar. 28, 2014, now U.S. Pat. No. 10,303,625, issued on May 28, 2019, which is a Continuation of U.S. patent application Ser. No. 13/668,935, filed on Nov. 5, 2012, now U.S. Pat. No. 8,725,920, issued on May 13, 2014, which is a Continuation of U.S. patent application Ser. No. 12/646,291, filed on Dec. 23, 2009, now U.S. Pat. No. 8,327,052, issued on Dec. 4, 2012, all of which are incorporated by reference herein in their entirety.

TECHNICAL FIELD

The subject innovation relates generally to memory systems and, in particular, to systems and methods that enable variable read latency on a serial memory bus.

BACKGROUND

A wide variety of memory devices can be used to maintain and store data and instructions for various computers and similar systems. In particular, FLASH memory is a type of electronic memory media that can be rewritten and that can retain content without consumption of power. Unlike dynamic random access memory (DRAM) devices and static random memory (SRAM) devices in which a single byte can be altered, FLASH memory devices are typically erased in fixed multi-bit blocks or sectors. FLASH memory technology can include NOR FLASH memory and/or NAND FLASH memory, for example. FLASH memory devices typically are less expensive and denser as compared to many other memory devices, meaning that FLASH memory devices can store more data per unit area.

FLASH memory has become popular, at least in part, because it combines the advantages of the high density and low cost of erasable programmable read-only memory (EPROM) with the electrical erasability of EEPROM. FLASH memory is nonvolatile; it can be rewritten and can hold its content without power. It can be used in many portable electronic products, such as cell phones, portable computers, voice recorders, thumbnail drives and the like, as well as in many larger electronic systems, such as cars, planes, industrial control systems, etc. The fact that FLASH memory can be rewritten, as well as its retention of data without a power source, small size, and light weight, have all combined to make FLASH memory devices useful and popular means for transporting and maintaining data.

FLASH memory arrays can be employed with a variety of interfaces or bus designs. For instance, a serial FLASH memory is becoming increasingly popular due to an efficient signal interface and cost effective packages. For example, a serial peripheral interface (SPI) has gained industry acceptance due to a low pin count and high clock rates. SPI FLASH memory is utilized by chipset vendors requiring reduced pin-counts and customers demanding lower cost solutions. For instance, SPI can provide a low pin-count solid state FLASH memory solution which equates to smaller board area and minimal signals to route. As system-on-a-chip (SoC) integrate more and more features, a low-pin count and low cost memory solution is attractive.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Systems and/or methods are disclosed that facilitate employing a variable read latency on a serial memory bus. In an aspect, a memory can utilize an undefined amount of time to obtain data from a memory array and prepare the data for transfer on the serial memory bus. The serial memory bus can be driven to a defined state. When data is ready for transfer, the memory can assert a start bit on the serial memory bus to notify a host prior to initiating the data transfer.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Systems and/or methods are presented that facilitate implementing variable latency characteristics in serial memory buses. In particular, a memory device can utilize an undefined amount of time to access, retrieve and transfer data from a memory array to a host. Once data from the memory array is ready for transfer, a start bit can be asserted on the data bus to notify the host. To avoid misinterpreting a tristate as the start bit, the data bus is driven to a defined state (e.g., a low state or a high state) such that detection of the start bit is unambiguous.

Figure 1:
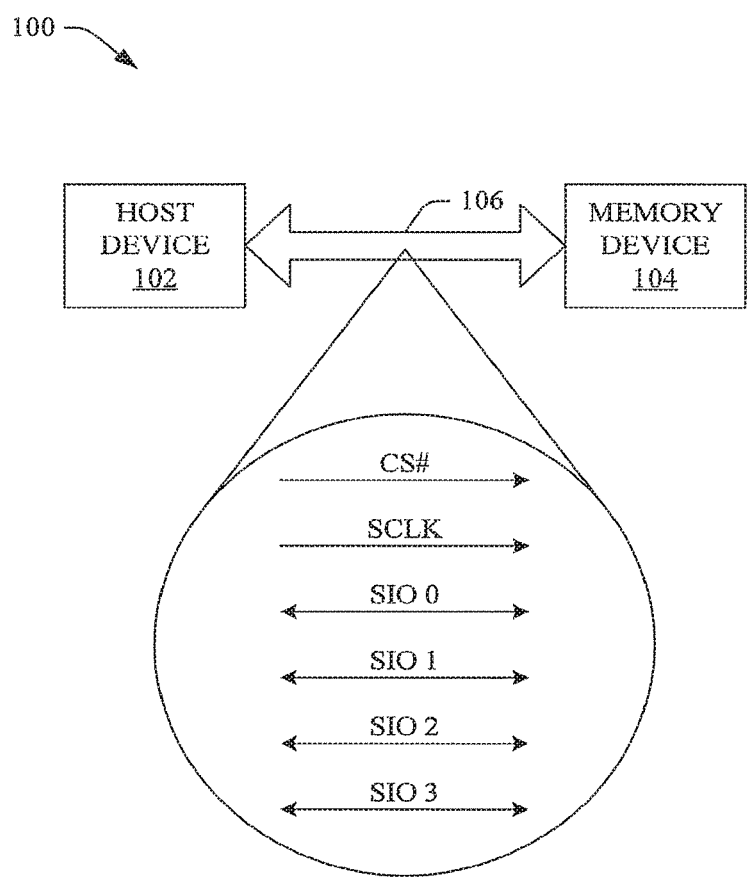
FIG. 1 illustrates a high-level block diagram of a system that employs a variable read latency in accordance with various aspects.

Referring initially to FIG. 1, illustrated is a system 100 that employs a variable read latency in accordance with various aspects. System 100 can include a host device 102 which communicates with a memory device 104 via a bus or interface 106. The host device 102 can include devices such as, but not limited to, a computer, a chipset, a system-on-a-chip, a memory controller, an integrated circuit, and/or any other suitable device capable of communicating, accessing, and/or utilizing the memory device 104. According to an example, the memory device 104 can be a non-volatile, solid state memory device, such as a FLASH memory device. However, it is to be appreciated that memory device 104 can employ disparate non-volatile memory structures. For instance, memory device 104 can be a read-only memory (ROM), a programmable ROM (PROM), an erasable PROM (EPROM), or an electrically EPROM (EEPROM). In another example, memory device 104 can be a non-volatile memory distinct from ROM or FLASH, such as, but not limited to, ferroelectric RAM (FeRAM), magnetoresistive RAM (MRAM), SONOS, or the like. In addition, aspects disclosed herein can be employed with volatile memory such as dynamic random access memory, static random access memory, or the like. Moreover, it is to be appreciated that host device 102 can employ aspects described herein with non-memory peripheral devices. For instance, the host device 102 can perform a read operation in connection with a temperature sensor or other sensor, a timer, an analog to digital converter, etc.

The host device 102 and memory device 104 can interact via the bus or interface 106. The host device 102 and memory device 104 can exchange signals or bits via the bus 106. In accordance with an aspect, bus 106 can be a serial peripheral interface (SPI). An example SPI bus is depicted in a breakout portion 108 of FIG. 1. Accordingly to this example, the SPI bus can include a chip select (CS #) line, a serial clock (SCLK) line, and one or more serial input/output (SIO) lines. Although four SIO lines are depicted (e.g. SIO 0-3), it is to be appreciated that the SPI bus is not constrained to four SIO lines, nor are the claims intended to be limited to implementations including four lines. Rather, the SPI bus can include any number of input/output lines greater than or equal to one.

Pursuant to an example, the host device 102 can select memory device 104 via the CS # line. In an aspect, the host device 102 can communicate with multiple devices (not shown) via the bus 106. In this regards, the host device 102 utilizes the CS # line to enable one device on the bus 106 to avoid contention. The CS # line can be an active low signal such that the host device 102 drives the CS # line low to select or enable memory device 104. Once selected, the memory device 104 can utilize the bus 106 to communicate with the host device 102.

The SCLK line can carry a clock signal that provides timing and synchronization. The clock signal can be generated by the host device 102 or by another module (not shown) associated with bus 106. The clock signal can provide a reference for the host device 102 and the memory device 104 during operations such as a read operation, a write operation, an erase operation, etc. For instance, a protocol can be established in terms of clock pulses of the clock signal, wherein the protocol instructs the memory device 104 and/or the host device 102 when to push data onto the SIO lines, what data to push, and how quickly to transition data. The SIO lines (e.g., SIO 0-3) can carry data signals, command signals, address signals, or the like. The SIO lines can be driven by either the host device 102 or the memory device 104. For instance, the host device 102 can drive the SIO lines to convey a command and/or a memory address to the memory device 104. The memory device 104 can drive the SIO lines to convey data bits retained in a memory array.

According to another example, a read operation on a legacy SPI bus can be tethered to the clock signal carried on the SCLK line. For instance, during a read operation, the memory device 104 can output data to bus 106 (e.g., on a SIO line) upon a low going clock edge (e.g., a transition, from high to low, of the clock signal). At a subsequent low going clock edge, the host device 102 can latch or capture the data. However, as clock frequency increases, a period of the clock signal decreases such that a time available for available data capture also shrinks.

In another example, data capture can be untethered from the clock signal. For instance, the host device 102 need not utilize a falling clock edge to capture data output by the memory device 104. According to this example, the host device 102 can find an optimal moment to sample data on bus 106. To facilitate determination of an appropriate data capture moment, the memory device 104 can output a read preamble prior to output of target data. In an aspect, the read preamble can be a known data pattern that enables the host device 102 to determine when data on bus 106 transitions into and out of a valid state. Once the host device 102 identifies when data becomes valid on bus 106 and then goes invalid, the host device 102 can configured a capture skew that corresponds to an optimal time to sample data on bus 106. In another example, the host device 102 need not determine when data on bus 106 goes invalid. For instance, the host device 102 can identify that a sufficient data valid window exists in order to configure an optimal capture skew.

In another example, memory device 104 and host device 102 can employ a variable latency on a read operation. For instance, a time between a read command and/or address and when requested data appears on bus 106 can be variable as opposed to a fixed number of clock cycles. As the host device 102 can be unaware of when data will appear on bus 106, the memory device 104 can send an indication on bus 106 to notify host device 102 that data is about to be output. In one example, the memory device 104 can output a start bit prior to driving data onto bus 106.

Figure 2:
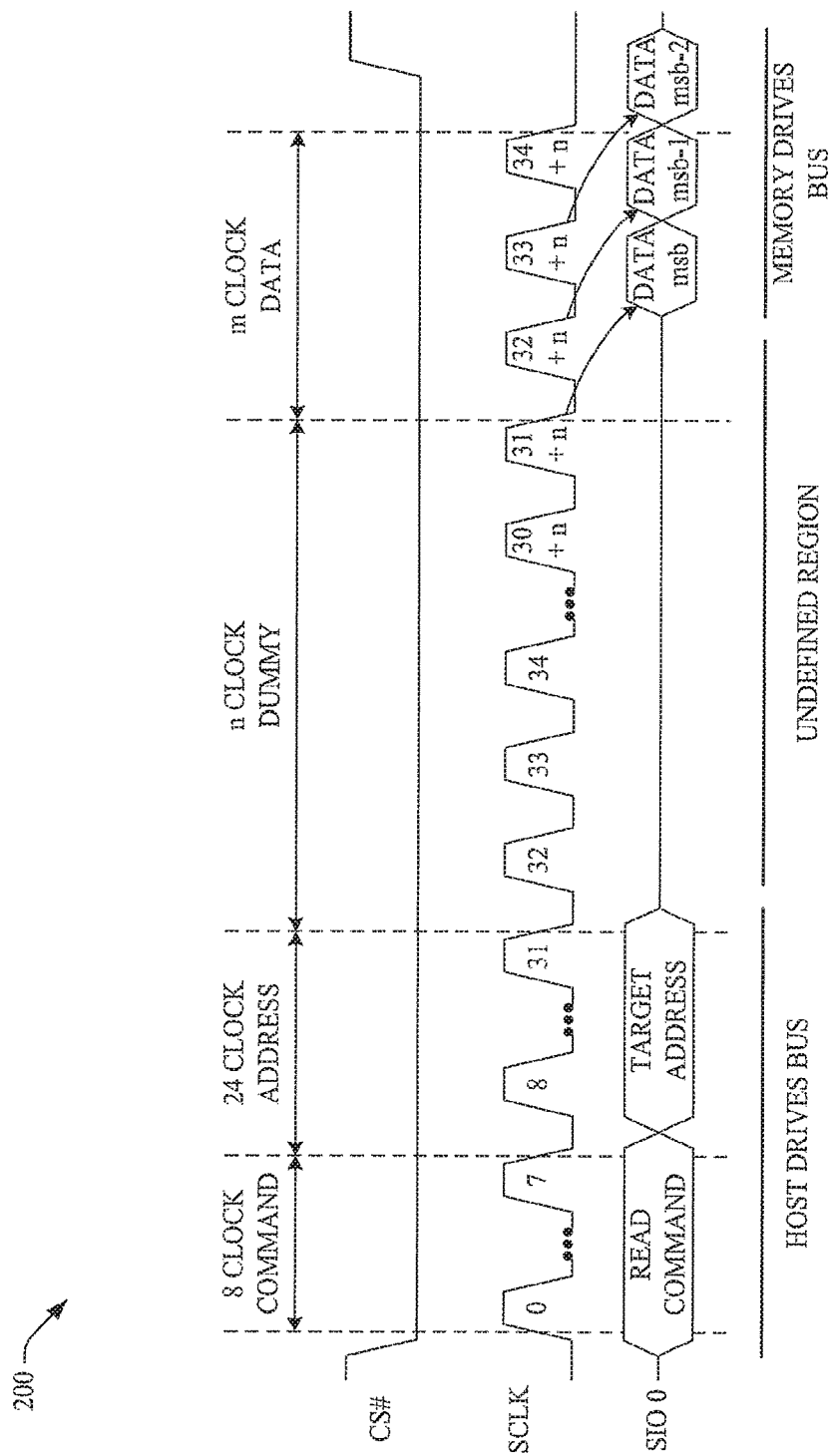
FIG. 2 depicts an example timing diagram illustrating a read operation in accordance with various aspects.

Referring now to FIG. 2, a timing diagram 200 is illustrated in accordance with various aspects. The timing diagram 200 depicts a read operation on a legacy SPI bus. As illustrated in FIG. 2, timing diagram 200 begins when a host controller specifies a command and an address during the initial portion of a read cycle. While timing diagram 200 depicts the read command having a 8 clock cycle duration and the address having a 24 clock cycle duration, it is to be appreciated that subject matter disclosed and claimed herein is not limited to such delineation. Additional clock cycles and/or fewer clock cycles can be allocated for the read command and the address. After the read command and address, the host controller waits for a memory device to drive target data (e.g., data located at the address provided by the host controller) onto the bus. At higher clock frequencies, several clock cycles can remain unused due to an initial read latency (e.g., a time between the command and address and when data is driven onto the bus). During these dummy clock cycles, no useful information is presented onto the SPI bus. It is to be appreciated that the dummy clock period can have a variable length of n clock cycles, where n is an integer greater than or equal to one. Following the dummy clock period, the memory device drives target data onto the bus. The data period can be variable in length depending on an amount of data requested by the host controller. As shown in timing diagram 200, the data period can be m clock cycles in duration, wherein m is an integer greater than or equal to one.

In an example, a read operation according to a legacy SPI protocol commences when a host device drives a chip select (e.g. CS #) line low. Subsequently, the host device issues a read command and an address. After the read command and the address, the host device places the SIO bus (e.g., the one or more input/output lines) into a tristate, corresponding to an undriven state. The host device then waits a predetermined number of clock cycles (e.g., n clock cycles in timing diagram 200) to accommodate a read latency. After the predetermined number of clock cycles, the memory device sequentially returns data starting at the target address. Once the target data has been delivered, the host device drives CS # high to terminate the read operation. As depicted in FIG. 2, the SIO bus is idle during clock cycles after the host specifies the target address and before the memory device starts outputting the requested data. During the idle period, the SIO bus is undriven so that contention is avoided when the memory device starts driving the bus.

Figure 3:
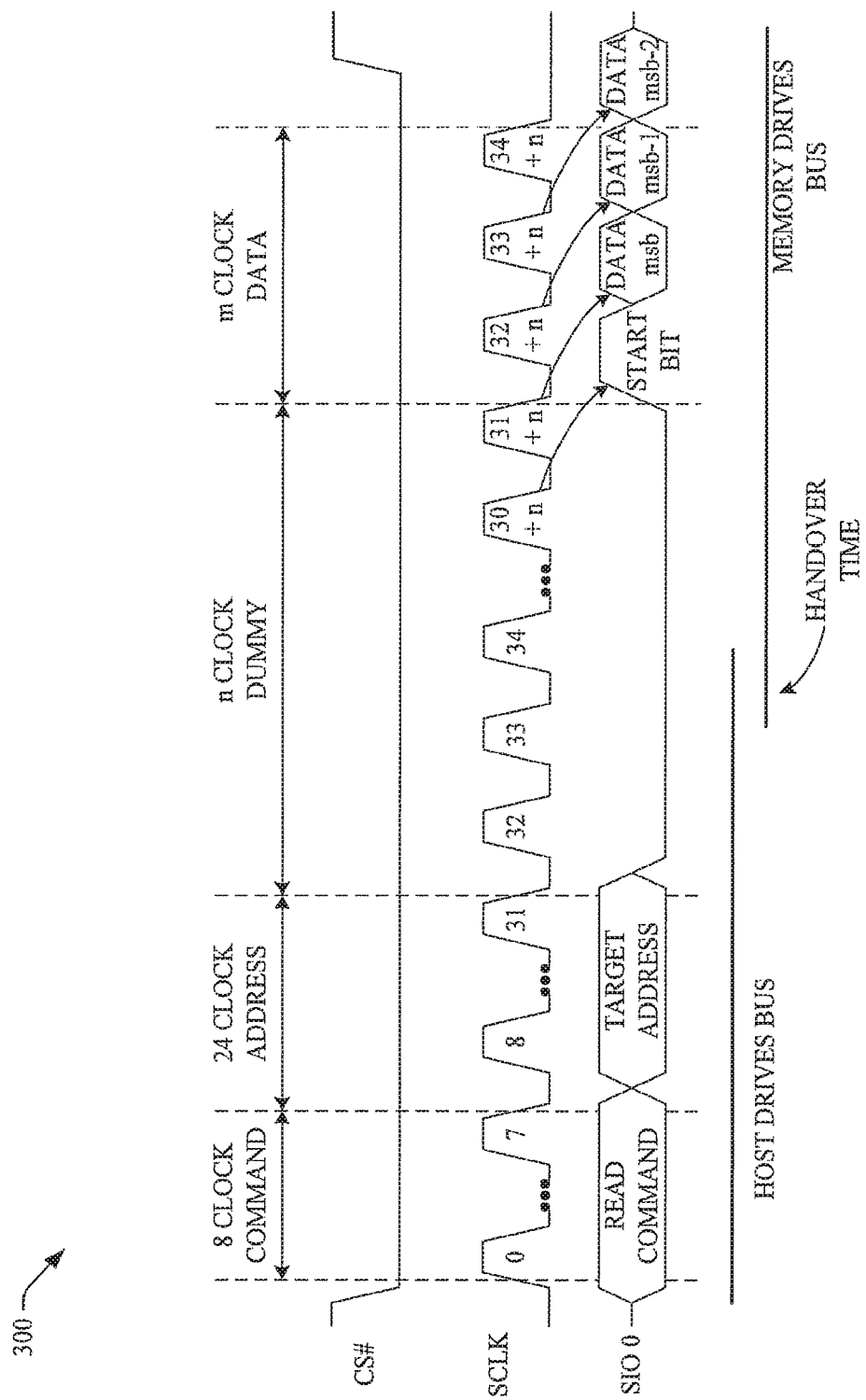
FIG. 3 illustrates an example timing diagram depicting a variable read latency during a read operation according to one or more aspects.

Turning to FIG. 3, an example timing diagram 300 is depicted. Timing diagram 300 illustrates a variable read latency during a read operation according to one or more aspects. As illustrated in FIG. 3, timing diagram 300 begins when a host controller specifies a command and an address during the initial portion of a read cycle. While timing diagram 300 depicts the read command having a 8 clock cycle duration and the address having a 24 clock cycle duration, it is to be appreciated that subject matter disclosed and claimed herein is not limited to such delineation. Additional clock cycles and/or fewer clock cycles can be allocated for the read command and the address. After the read command and address, the host controller waits for a memory device to drive target data (e.g., data located at the address provided by the host controller) onto the bus. It is to be appreciated that the dummy clock period can have a variable length of n clock cycles, where n is an integer greater than or equal to one. Following the dummy clock period, the memory device drives target data onto the bus. The data period can be variable in length depending on an amount of data required by the host controller. As shown in timing diagram 300, the data period can be m clock cycles in duration, wherein m is an integer greater than or equal to one.

Parallel burst NOR memory busses can incorporate variable latency via a dedicated WAIT signal. During read operations, the WAIT signal is asserted until data is ready to be output on a data bus. Once data is ready, the WAIT signal is deasserted and data is transferred from the memory to the host. In an example, variable latency can be beneficial in burst pseudostatic RAM (PSRAM) devices where a longer latency can occur when a read operation coincides with an internal refresh.

In accordance with an aspect, variable latency can be incorporated into SPI buses without increasing pin-counts (e.g., without adding additional signals). As shown in FIG. 3, the memory can include a start bit prior to asserting target data. The host can detect the start bit on the SIO bus and prepare to capture target data on a subsequent clock cycle. To facilitate proper identification of the start bit, the host can drive the SIO bus to a low or 0 state after issuing the address. The host can drive the SIO bus low for a predetermined number of clock cycles at which point the memory continues to drive the SIO bus low until the start bit. To ensure that the SIO bus remains low, the host and memory will overlap for a handover time, wherein, during the handover time, both the host and memory drive the bus low. It is to be appreciated that the host can drive the SIO bus to a high or 1 state after issuing the address. Accordingly, the start bit indicated by the memory can be a 0 bit. In addition, the start bit can be immediately prior target data or the start bit can occur a predetermined number of clock cycles prior to the target data.

To facilitate explanation, the aspects above are described in connection with an SPI bus. However, it is to be appreciated that preambles can be employed with other bus interfaces such as, but not limited to, Burst NOR, uWire, etc. In addition, the foregoing is presented in terms of a single data rate (SDR) implementation; however, other timing strategies, such as a double data rate (DDR) implementation can be employed.

Figure 4:
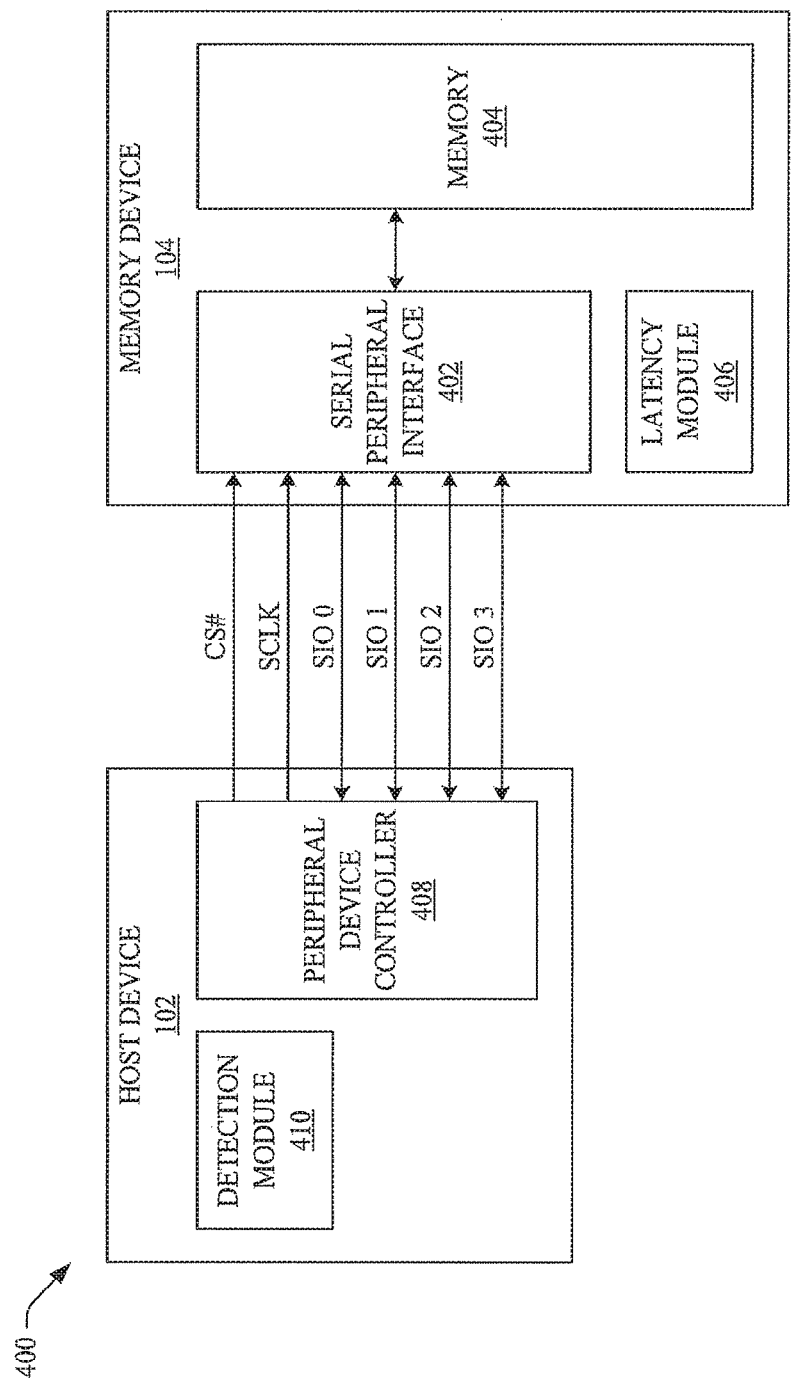
FIG. 4 is a block diagram of a system for enabling variable read latency on a serial bus in accordance with various aspects.

Turning to FIG. 4, illustrated is a system 400 for enabling variable read latency on a serial bus in accordance with various aspects. System 400 can include a memory device 104 and a host device 102, which can communicate via a bus, such as an SPI bus. It is to be appreciated that memory device 104 and host device 102 can be similar to and include similar functionality as memory device 104 and host device 102 described above with reference to FIG. 1.

The memory device 104 can include a serial peripheral interface 402 that implements a serial peripheral interface (SPI) protocol. The serial peripheral interface 402 enables the memory device 104 to communicate via the SPI bus in accordance with the SPI protocol. For instance, the serial peripheral interface 402 enables the memory device 104 to be accessed by the SPI bus and, in turn, drive data onto the SPI bus. The SPI bus can include a plurality of routes or lines that carry a variety of signals. For example, the SPI bus can include a chip select line (CS #), a serial clock line (SCLK), and input/output lines (e.g., SIO 0-3). While four input/output lines are depicted in FIG. 4, it is to be appreciated that the SPI bus can include only one input/output line or any other number of input/output lines.

The memory device 104 can also include a memory array 404. The memory array 404 can be non-volatile, solid state memory such as FLASH memory. However, it is to be appreciated that memory array 404 can be any suitable memory such as ROM, DRAM, SDRAM, etc. The serial peripheral interface 402 can access the memory array 404 to obtain data stored therein, to provide data to be stored, to erase data, etc. In another example, the serial peripheral interface 402 can interact with other devices besides, or in parallel with, memory device 104. For instance, the serial peripheral interface 402 can interact with a non-memory peripheral which does not include memory array 404. For instance, the non-memory peripheral can be a sensor, a timer, a converter (e.g., analog to digital), etc.

In accordance with an aspect, the memory device 104 can include a latency module 406, which can implement a variable latency period during a read operation. The latency module 406 can determine when data is ready to be output to the host device 102 via the SPI bus and instruct the serial peripheral interface 402 to assert a start bit prior to the data. The host device 102 can include a peripheral device controller 408 that interfaces with the memory device 104 via the SPI bus. The host device 102 can also include a detection module 410 that identifies the start bit on the SPI bus.

In accordance with an example, the host device 102 can initiate a read operation with memory device 104 via the SPI bus. The peripheral device controller 408 can output a read command and an address on at least one input/output line of the SPI bus (e.g., the SIO bus). After the read command and the address, the peripheral device controller 408 can drive the SIO bus to a low state. The peripheral device controller 408 can hold the SIO bus in the low state for a plurality of clock pulses. When the peripheral device controller 408 ceases driving the SIO bus to the low state, the serial peripheral interface 402 continues to drive the bus to the low state. In one aspect, there is a handover time during which the serial peripheral interface 402 begins to drive the SIO bus to a low state prior to the peripheral device controller 408 releasing the SIO bus. During the idle period, the memory device 104 accesses the memory array 404, obtains and/or buffers target data. Once the target data is ready, the latency module 406 can instruct the serial peripheral interface 402 to issue the start bit on the SIO bus. In the situation where the SIO bus is driven low, the start bit can be a one bit. In another example, the SIO bus can be driven high and the start bit can be a zero bit. Once the start bit is asserted, the detection module 410 can observe the SIO bus transitioning from a low state to a high state. The detection module 410 can instruct the peripheral device controller 408 to prepare for data capture. After the start bit, the memory device 104 can transfer the target data to the host device 102. The transfer of the target data can commence immediately after the start bit or after a predetermined number of clock cycles. Accordingly, introduction of the start bit enables the memory device 104 to implement variable latency characteristics that allows the memory device 104 to optimize initial access time based upon an internal state.

FIG. 4 depicts the detection module 410 as separate entity. However, it is to be appreciated that the aforementioned component can be incorporated into the peripheral device controller 408. Moreover, system 400 can be a single data rate environment or a double data rate environment.

Figure 5:
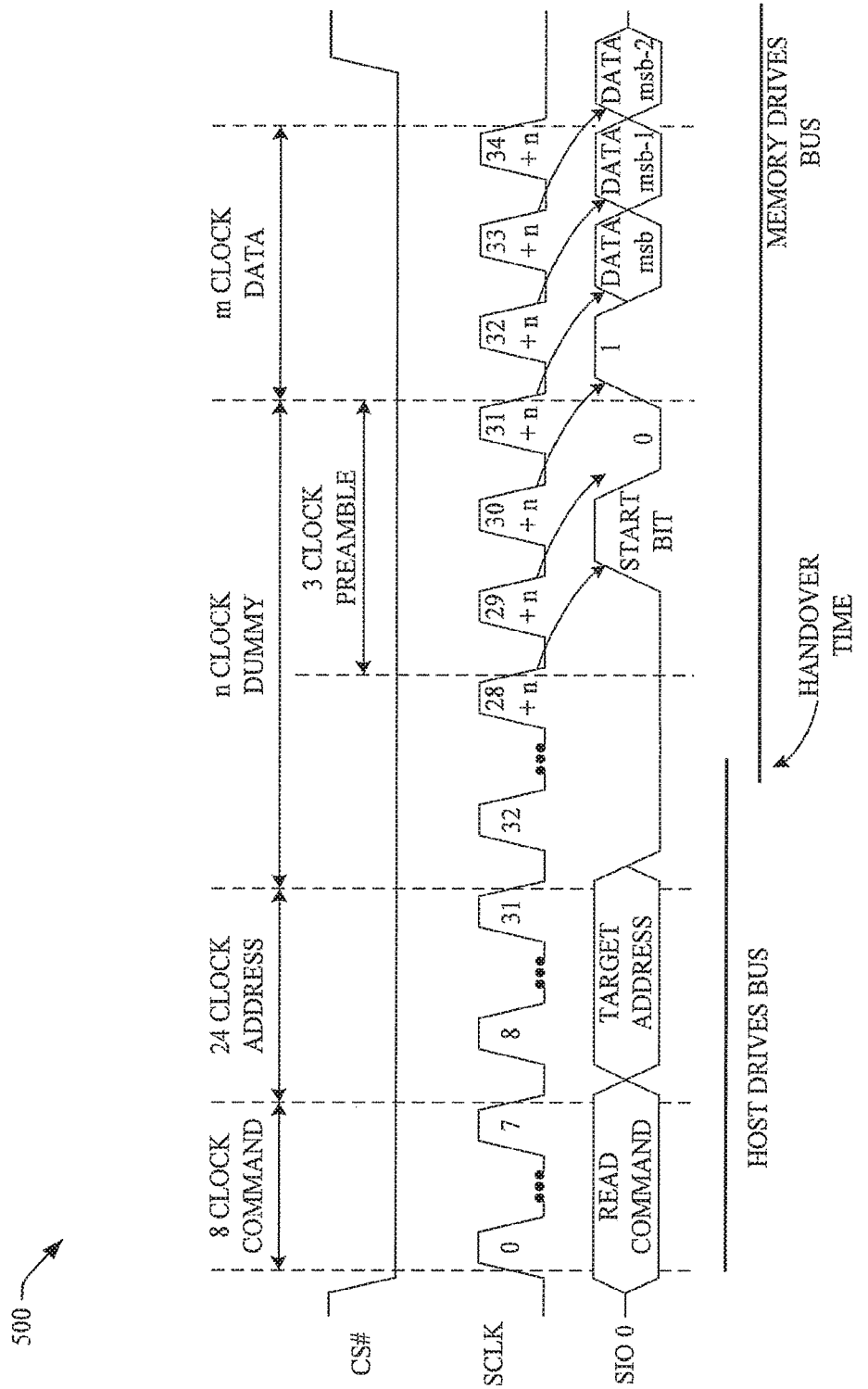
FIG. 5 is an example timing diagram illustrating a read operation that employs a read preamble while enabling variable latency in accordance with various aspects.

Turning to FIG. 5, an example timing diagram 500 is depicted. Timing diagram 500 illustrates a read operation that employs a read preamble in accordance with various aspects. As illustrated in FIG. 5, timing diagram 500 begins when a host controller specifies a command and an address during the initial portion of a read cycle. While timing diagram 500 depicts the read command having a 8 clock cycle duration and the address having a 24 clock cycle duration, it is to be appreciated that subject matter disclosed and claimed herein is not limited to such delineation. Additional clock cycles and/or fewer clock cycles can be allocated for the read command and the address. After the read command and address, the host controller waits for a memory device to drive target data (e.g., data located at the address provided by the host controller) onto the bus. Following the command and address is a dummy period which can have a variable length of n clock cycles, where n is an integer greater than or equal to one. Following the dummy clock period, the memory device drives target data onto the bus. The data period can be variable in length depending on an amount of data requested by the host controller. As shown in timing diagram 500, the data period can be m clock cycles in duration, wherein m is an integer greater than or equal to one. Moreover, in FIG. 5, an arrow connects a falling clock edge with an associated data bit tied thereto.

According to an example, a memory device can implement variable latency characteristics by asserting a start bit to notify a host that data transfers is commencing. In an aspect, the start bit can be a first bit of a preamble asserted prior to data from a memory array being driven onto the SPI bus. The preamble can be utilized by the host controller to determine a period of time valid data is available on the bus. Once the host controller determines the period in which data is valid, a skew time can be selected to maximize a read timing margin. In an aspect, the preamble can be a known data pattern (e.g., known a priori by the host controller). While timing diagram 500 depicts to the preamble to be three clock pulses in duration and have a pattern of 101, it is to be appreciated that the preamble can be a longer or shorter preamble. In addition, the preamble can be other values in addition to the preamble value illustrated in FIG. 5.

To facilitate explanation, the aspects above are described in connection with an SPI bus. However, it is to be appreciated that preambles can be employed with other bus interfaces such as, but not limited to, Burst NOR, uWire, etc. In addition, the foregoing is presented in terms of a single data rate (SDR) implementation; however, other timing strategies, such as a double data rate (DDR) implementation can be employed.

Figure 6:
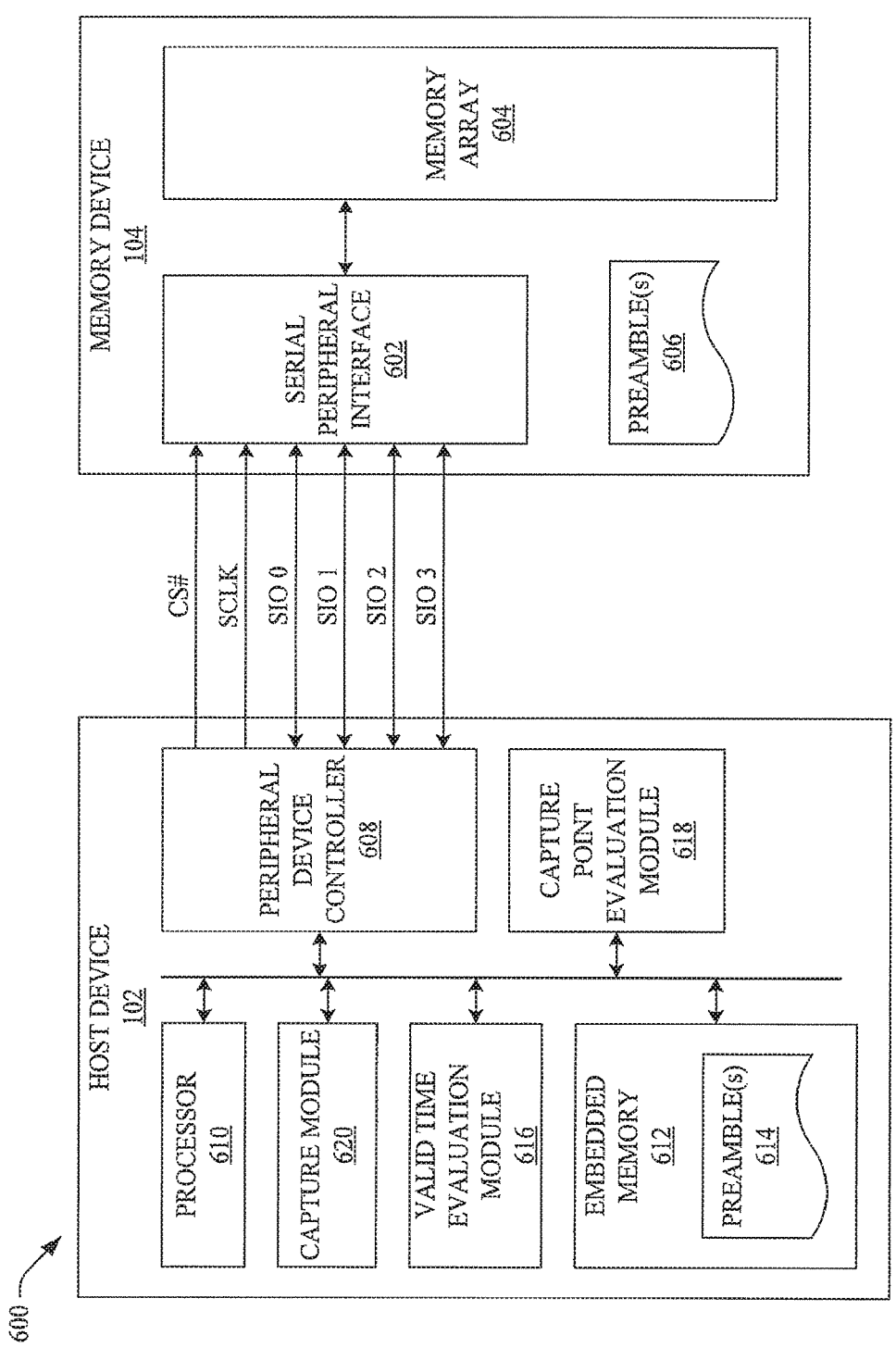
FIG. 6 illustrates a block diagram of a system for employing a read preamble with a serial memory to optimize data capture in accordance with various aspects.

Turning now to FIG. 6, an example system 600 for employing a read preamble with a serial memory to optimize data capture is illustrated. System 600 can include a memory device 104 and a host device 102, which can communicate via a bus, such as an SPI bus. It is to be appreciated that memory device 104 and host device 102 can be similar to and include similar functionality as memory device 104 and host device 102 described above with reference to FIG. 1.

The memory device 104 can include a serial peripheral interface 602 that implements a serial peripheral interface (SPI) protocol. The serial peripheral interface 602 enables the memory device 104 to communicate via the SPI bus in accordance with the SPI protocol. For instance, the serial peripheral interface 602 enables the memory device 104 to be accessed by the SPI bus and, in turn, drive data onto the SPI bus. The SPI bus can include a plurality of routes or lines that carry a variety of signals. For example, the SPI bus can include a chip select line (CS #), a serial clock line (SCLK), and input/output lines (e.g., SIO 0-3). While four input/output lines are depicted in FIG. 6, it is to be appreciated that the SPI bus can include only one input/output line or any other number of input/output lines.

The memory device 104 can also include a memory array 604. The memory array 604 can be non-volatile, solid state memory such as FLASH memory. However, it is to be appreciated that memory array 604 can be any suitable memory such as ROM, DRAM, SDRAM, etc. The serial peripheral interface 602 can access the memory array 604 to obtain data stored therein, to provide data to be stored, to erase data, etc. In another example, memory device 104 can be a non-memory peripheral which does not include memory array 604. For instance, the memory device 104 can be a sensor, a timer, a converter (e.g., analog to digital), etc.

According to an aspect, the memory device 104 can include a preamble 606. The preamble 606 can be a known data pattern having a sequence of one or more bits. The preamble 606 can be output by the memory device 104 during a read operation. For instance, prior to driving data from memory array 604 in accordance with an address obtained on the input/output lines from host device 102, the memory device 104 can drive the preamble 606 onto the input/output lines. The preamble 606 can be output during an idle period (e.g., the dummy clock period from previous figures) of the SPI bus. In one example, the preamble 606 can be output on a single input/output line (e.g., SIO 0). In another example, the preamble 606 can be driven onto two or more input/output lines. In addition, the preamble driven onto multiple lines can be an identical preamble or a set of disparate preambles.

The host device 102 can include a peripheral device controller 608 that interfaces with the memory device 104 via the SPI bus. The host device 102 can also include a processor 610, such as a central processing unit (CPU) and an embedded memory 612. In one aspect, the embedded memory 612 can retain one or more preamble data patterns 614.

In accordance with an example, the host device 102 can initiate a read operation with memory device 104 via the SPI bus. The peripheral device controller 608 can output a read command and an address on at least one input/output line of the SPI bus. After the read command and the address, a series of clock pulses can occur without activity while the memory device 104 accesses the memory array 604, obtains and/or buffers target data. During the period of inactivity, the serial peripheral interface 602 of memory device 104 can output preamble 606 onto one or more input/output lines of the SPI bus.

Peripheral device controller 608 can detect when one or more of the input/output lines of the memory or peripheral device transition out of a tri-state or undriven state, and, subsequently, initiate a training procedure. The preamble data training pattern output by memory device 104 can be known by the host device 102. For example, the preamble can be selected by the host device 102 during a power-up sequence, during the read command, or the like. In another example, the memory device 104 can include a specification that indicates preamble 606 utilized.

During the training procedure, the host device 102 can employ a valid time evaluation module 616 to determine a period of time data is valid on the SPI bus. In accordance with an example, the valid time evaluation module 616 can utilize a known preamble data pattern 614 corresponding to preamble 606 and observe the input/output line(s) of the SPI bus transition in accordance with the preamble data pattern 614. In one aspect, a clock frequency of processor 610 and/or the host device 102 can be higher than a frequency of the serial clock (SCLK) of the SPI bus. However, it is to be appreciated that other capture techniques can be utilized in concert with or in place of a higher host clock frequency. Accordingly, the host device 102 can sample the input/output lines of the SPI bus multiple times during each clock pulse of the serial clock.

The valid time evaluation module 616 can identify a time when each bit of preamble 614 becomes valid and a time when the each bit goes invalid. These times can be recorded for each bit presented during the preamble period. In one example, a difference between the times a bit becomes valid and then goes invalid can be a valid data period. The valid time evaluation module 616 can statistically combine the valid data periods of all bits of preamble 614. For instance, the valid time evaluation module 616 can determine an average valid data period.

In another aspect, a capture point evaluation module 618 of host device 102 can utilize the average valid data period to determine an optimal capture point. The optimal capture point can be a skew time from a falling clock edge, or other reference, which maximizes a margin for reading the data on the input/output lines. A capture module 620 can be configured in accordance with the optimal capture point. For instance, the capture module 620 can be configured to sample data on the input/output lines of the SPI bus at the optimal capture point following a falling clock edge of the serial clock.

In one example, the training procedure described above can be performed during every read operation. For instance, variance in temperature and voltage during a read operation can be minimal such that the optimal capture point need not be updated. However, between adjacent read operations, a valid data window can shift such that recalibration is recommended.

In accordance with an example, a first bit of a preamble can be a start bit utilized to implement variable latency characteristics. The start bit can notify the host device 102 that the memory device 104 is ready to transfer target data.

FIG. 6 depicts the valid time evaluation module 616, the capture point evaluation module 618, and the capture module 620 as separate entities. However, it is to be appreciated that the aforementioned components can be incorporated into a single entity, and/or incorporated into either the peripheral device controller 608. Moreover, system 600 can be a single data rate environment or a double data rate environment.

Figure 7:
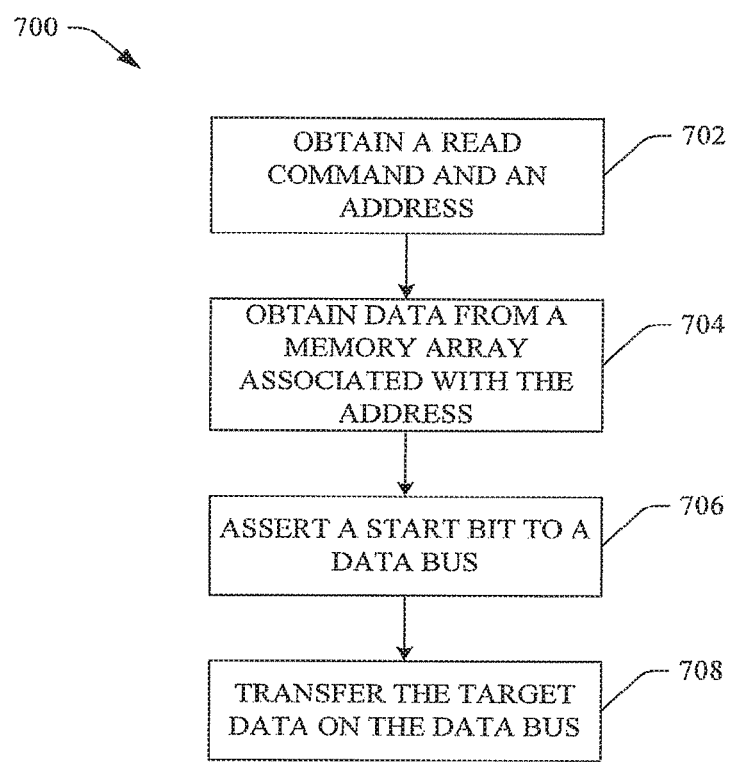
FIG. 7 is a flow diagram of an example methodology for utilizing a start bit to implement variable latency characteristics.
Figure 8:
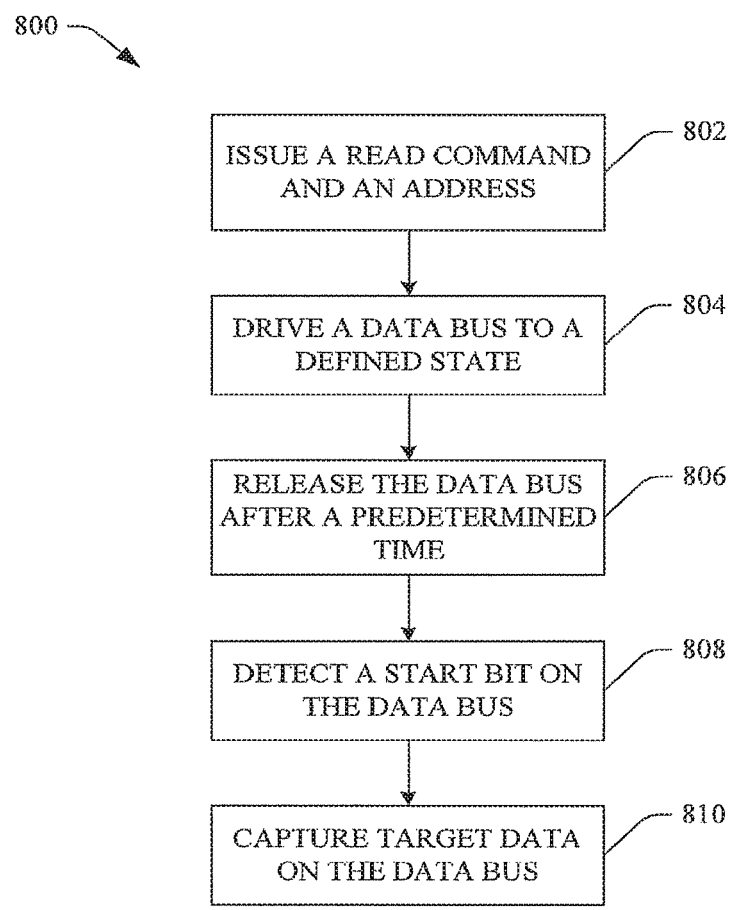
FIG. 8 is a flow diagram of an example methodology for identifying when a memory device is ready to transfer data in accordance with an aspect.
Figure 9:
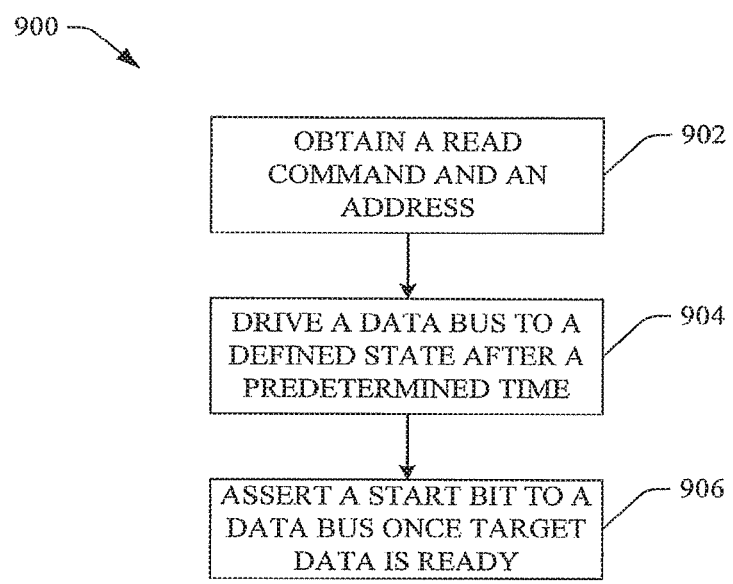
FIG. 9 is a flow diagram of an example methodology for implementing variable latency in a memory device.

FIGS. 7-9 illustrate example methodologies for implementing variable latency characteristics for read operations on a serial memory bus. While, for purposes of simplicity of explanation, the processes or methodologies are shown and described as a series or number of acts, it is to be understood and appreciated that the subject processes are not limited by the order of acts, as some acts may, in accordance with the subject processes, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the subject processes described herein.

Referring to FIG. 7, a method 700 for utilizing a start bit to implement variable latency characteristics is illustrated. In one aspect, method 700 can be employed by a memory device to notify a host when data is ready. In addition, the memory device and the host can utilize a serial peripheral interface (SPI) protocol and bus to communicate. At reference numeral 702, a read command and an address is obtained from a host. At reference numeral 704, a memory array can be accessed to obtain data associated with the address. In one example, the memory array can be a nonvolatile, solid state memory, such as FLASH memory. In another example, a latency period can transpire while the memory array is accessed, wherein the latency period includes a variable length. At reference numeral 706, a start bit is asserted on a data bus. In an aspect, the start bit can be asserted once data from the memory array is ready to be transferred. The data bus can be a serial input/output bus (e.g., SIO lines) of the SPI bus. At reference numeral 708, the target data associated with the address is output on the data bus.

FIG. 8 depicts a method 800 for identifying when a memory device is ready to transfer data in accordance with an aspect. In one example, method 800 can be employed by a host device (e.g., master) communicating with a memory device or other non-memory peripheral (e.g., slave), wherein the memory device and host device utilize a SPI bus and protocol. At reference numeral 802, a read command and address are issued to a memory device. For instance, an SPI bus, and more particularly, a data bus or input/output lines of the SPI bus can be utilized to convey the command and address. In accordance with one example, the read command and address are obtained, from a master device (e.g., host device 102, peripheral device controller 408, etc.), by a slave device (e.g., memory device 104, non-memory peripheral device, etc.). At reference numeral 804, the data bus is driven to a defined state. In one example, the defined state is a low or zero state. However, it is to be appreciated that the defined state can be a high or one state. In another example, the bus is driven to the defined state by a master device. At reference numeral 806, the driving of the data bus is released after a predetermined time. In accordance with an example, the predetermined time can include one or more clock cycles that include a handover time. During the handover time, the data bus is simultaneously driven to the defined state by the memory device (e.g., slave device) prior to the release by the host device (e.g., master device). At reference numeral 808, a start bit is observed on the data bus. In an aspect, the start bit is observed when the data bus transitions from the defined state to an opposite state. For instance, the start bit can transition the data bus from a low state to a high state or from a high state to a low state. In an aspect, the start bit is asserted by a slave device on the bus and observed by a master device on the bus. At reference numeral 810, target data associated with the address is captured on the data bus. The target data can be captured by a master device, for example.

Turning now to FIG. 9, a method 900 for implementing variable latency in a memory device is illustrated. In one example, method 900 can be employed by a slave device communicating with a master device, wherein the slave device and master device utilize an SPI bus and protocol. The slave device can be a memory device or a non-memory peripheral device. At reference numeral 802, a read command and an address is obtained. For example, the master device can issue the read command and address to the slave device. At reference numeral 904, a data bus is driven to a defined state after a predetermined time. In one example, the slave device drives the bus to a defined state after the predetermined time. The predetermined time can comprise one or more clock cycles, which also include a handover time. During the handover time, the data bus is simultaneously driven to the defined state by one or more devices. For example, during the handover time, the slave device and the master device simultaneously drive the data bus to the defined state. At the conclusions of the handover time, the data bus is released by other devices (e.g., the master device) and is driven only by the device that will output data (e.g., the slave device). At reference numeral 906, a start bit is asserted to the data bus once target data (e.g., data associated with the address) is ready to be transferred on the data bus. In an aspect, the slave device can assert the start bit on the data bus.

Figure 10:
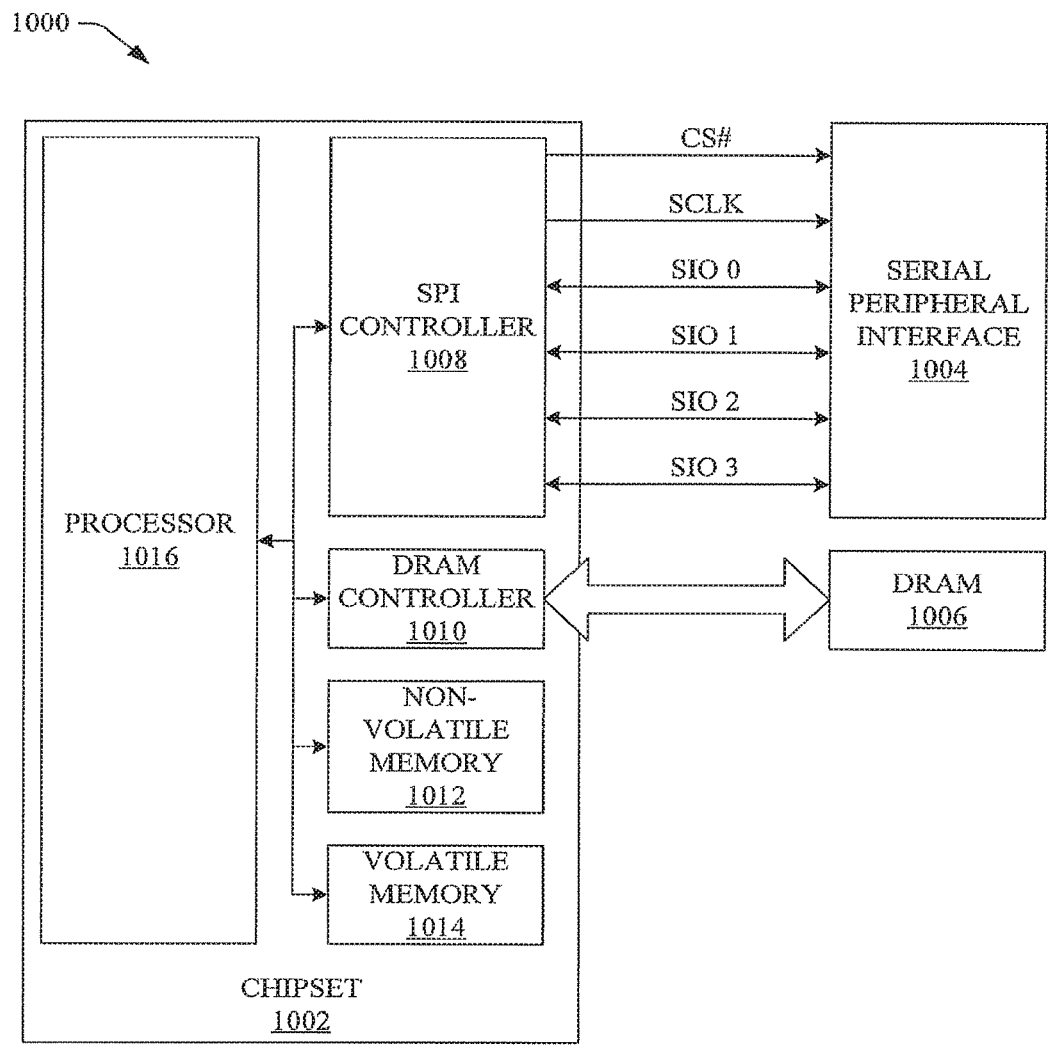
FIG. 10 is a block diagram of an example system that can employ a serial memory.

Referring to FIG. 10, illustrated is a block diagram of an exemplary, non-limiting system 1000 that can comprise and/or incorporate system 100, system 400, system 600 or a respective portion(s) thereof, and/or implement methodology 700, methodology 800 and/or methodology 900, or respective portions thereof. System 1000 can implement a serial peripheral interface between a chipset 1002 and a serial peripheral interface 1004. In accordance with an example, the chipset 1002 can be incorporated into an electronic device such as, but not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like. In another example, the serial peripheral interface 1004 can be a memory device or a non-memory peripheral device.

The chipset 1002 can include an SPI controller 1008 which can communicate with the serial peripheral interface 1004 via a SPI bus. The SPI bus can include a variety of signal lines, routes and/or pins. For instance, the SPI can include a chip select line (e.g., CS #) that enables the SPI controller to select the serial peripheral interface 1004, a serial clock (SCLK) line that provides a clock signal as a reference to implement an SPI protocol, and one or more input/output lines (SIO 0-3) that carry command and data signals between the serial peripheral interface 1004 and the chipset 1002.

System 1000 can also include a volatile memory device such as DRAM 1006 communicatively coupled via a DRAM bus to a DRAM controller 1010. The DRAM controller can utilize a DRAM protocol to enable chipset 1002 to access and employ DRAM 1006. In addition, chipset 1002 can include a variety of a variety of computer-readable media. Computer-readable media can be any available media that can be accessed by the chipset 1002. By way of example, and not limitation, computer-readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory (e.g., FLASH memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by chipset 1002. Communication media typically embodies computer readable instructions, data structures, program modules or other data in a modulated data signal such as a carrier wave or other transport mechanism and includes any information delivery media. In one example, chipset 1002 can include an embedded non-volatile memory 1012 and an embedded volatile memory 1014.

The non-volatile memory 1012 can be removable or non-removable. For example, the non-volatile memory 1012 can be in the form of a removable memory card or a USB FLASH drive. In accordance with one aspect, the non-volatile memory 1012 can include FLASH memory (e.g., single-bit FLASH memory, multi-bit FLASH memory), ROM, PROM, EPROM, EEPROM, or NVRAM (e.g., FeRAM), or a combination thereof, for example. Further, a FLASH memory can comprise NOR FLASH memory and/or NAND FLASH memory. In accordance with another aspect, the non-volatile memory 1012 can comprise one or more memory components. The volatile memory 1012 can include RAM, DRAM, SRAM, SDRAM, RDRAM, and the like.

A basic input/output system (BIOS), containing the basic routines that can facilitate transferring information between elements within chipset 1002, such as during start-up, can be stored in the non-volatile memory 1012 and/or the volatile memory 1014. The non-volatile memory 1012 and/or the volatile memory 1014 can also contain data and/or program modules that can be accessible to and/or presently be operated on by a processor 1016. By way of example, and not limitation, the non-volatile memory 1012 and/or the volatile memory 1014 can also include an operating system (s), application programs, other program modules, and program data. In addition, the non-volatile memory 1012 and/or the volatile memory 1014 can include code (e.g., bootstrapping code) that enables the chipset 1002 to access a memory (not shown) associated with the serial peripheral interface 1004 to obtain operating system code, application code, or other data and shadow the obtained information to the volatile memory 1014 and/or DRAM 1006.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

It is also to be understood and appreciated that cryptographic protocols can be employed to facilitate security of data associated with a memory (e.g., memory device 104) in accordance with the disclosed subject matter. For example, a cryptographic component (e.g., cryptographic engine) can be employed and can facilitate encrypting and/or decrypting data to facilitate securing data being written to, stored in, and/or read from the memory. The cryptographic component can provide symmetric cryptographic tools and accelerators (e.g., Twofish, Blowfish, AES, TDES, IDEA, CAST5, RC4, etc.) to facilitate data security. The cryptographic component can also provide asymmetric cryptographic accelerators and tools (e.g., RSA, Digital Signature Standard (DSS), and the like) to facilitate securing data. Additionally, the cryptographic component can provide accelerators and tools (e.g., Secure Hash Algorithm (SHA) and its variants such as, for example, SHA-0, SHA-1, SHA-224, SHA-256, SHA-384, and SHA-512) to facilitate data security.

It is to be appreciated and understood that authentication protocols can be employed to facilitate security of data associated with the memory (e.g., memory component 102) in accordance with the disclosed subject matter. For example, an authentication component can solicit authentication data from an entity, and, upon the authentication data so solicited, can be employed, individually and/or in conjunction with information acquired and ascertained as a result of biometric modalities employed, to facilitate control access to the memory. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by the authentication component. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

As utilized herein, terms "component," "system," "interface," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and FLASH memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A method comprising:
receiving a request for data associated with an address via a bus, wherein the bus is driven to a first state after the request;
responsive to the request, accessing a memory array of a memory device to obtain the data, wherein the bus is driven to maintain at the first state at least partly by the memory device during an entire period of the accessing the memory array;
transitioning the bus from the first state to a second state; and
after the transitioning of the bus, driving the data onto the bus.

2. The method of claim 1, wherein the driving the data on the bus comprises starting the driving of the data onto the bus a predetermined number of clock cycles after the transitioning of the bus from the first state to the second state.

3. The method of claim 1, wherein the transitioning of the bus from the first state to the second state comprises driving the bus to the second state.

4. The method of claim 3, wherein the transitioning of the bus from the first state to the second state comprising switching from driving the bus to the first state to driving the bus to the second state.

5. The method of claim 1, wherein the transitioning of the bus comprises asserting a preamble that drives the bus to the second state and indicates a period of time that the data will be valid and available on the bus.

6. The method of claim 5, wherein the preamble includes a start bit, and wherein the start bit is in a state that is opposite to the first state.

7. The method of claim 5, further comprising:
capturing the data, by a host device, on the bus when the preamble is detected.

8. The method of claim 7, wherein the bus is driven to maintain at the first state at least partly by the host device during the entire period of the accessing the memory array.

* * * * *